CIRCUIT ARRANGEMENT FOR THE AUTOMATIC GAIN CONTROL IN A SUPERHETERODYNE RECEIVER

Filed March 20, 1964

INVENTOR.

PETER J.H. JANSSEN

BY

Frank R. Jeifari

AGENT

United States Patent Office 3,333,199

Patented July 25, 1967

3,333,199

CIRCUIT ARRANGEMENT FOR THE AUTOMATIC GAIN CONTROL IN A SUPERHETERODYNE RECEIVER

Peter Johannes Hubertus Janssen, Emmasingel, Eindhoven, Netherlands, assignor to North American Philips Company, Inc., New York, N.Y., a corporation of Delaware Filed Mar. 20, 1964, Ser. No. 353,395
Claims priority, application Netherlands, Mar. 29, 1963, 290,929
6 Claims. (Cl. 325—404)

Figures 1, 2:
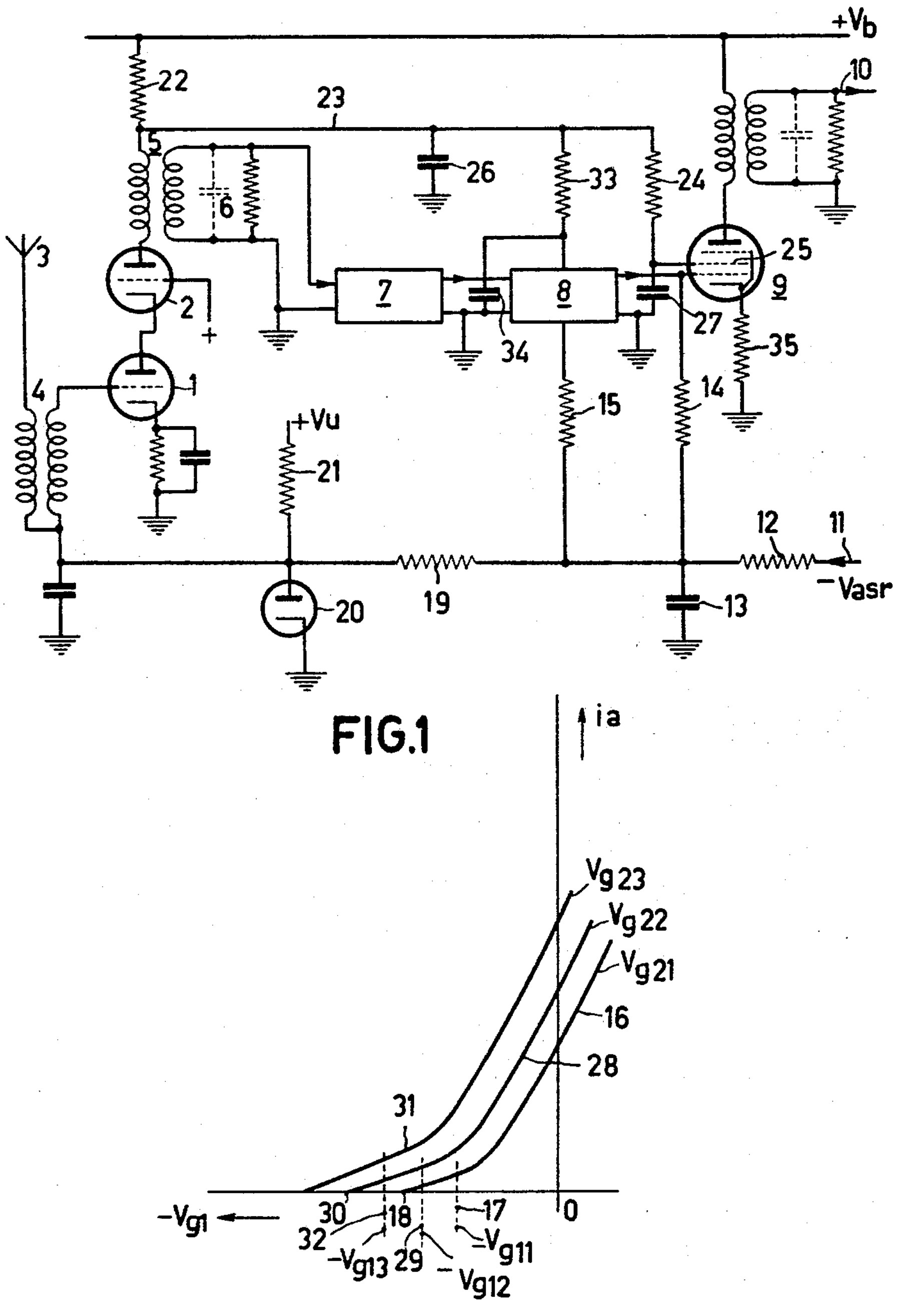

The invention relates to a circuit arrangement for the automatic gain control in a superheterodyne receiver comprising a high-frequency part, an intermediate-frequency part, a supply voltage part, and a detector for producing a negative voltage for the automatic gain control from the intermediate-frequency signal, which negative voltage is supplied, through the required smoothing means, to the control grid of at least one tube with a control characteristic, belonging to the intermediate-frequency part, and, through a delay circuit, to the control grid of at least one tube with control characteristic, belonging to the high-frequency part and/or the mixing part.

In the known circuit arrangements of this type it is common practice for obtaining a signal-to-noise ratio for the intermediate frequency amplifier of the receiver which is as favourable as possible, to cause the control of the high-frequency part of this receiver to start as late as possible, that is to say, as will be explained below, to cause the signal intensity for the intermediate-frequency amplifier tubes to increase as far as possible until too large a cross-modulation in the mixer tube of the receiver is to be feared and to cause the negative voltage for the automatic gain control of the high-frequency part to begin only then. This involves, however, that after the beginning of the control of the high-frequency part, this control has to vary much more steeply than for the intermediate-frequency part. As a matter of fact, the signal intensity for the intermediate-frequency part, after the said beginning of the high-frequency control, may substantially not increase any longer since otherwise the possibility of too large a cross-modulation in the mixer tube would occur. In order to achieve this, a strong increase of the produced voltage for the automatic gain control which is supplied to the high-frequency part is necessary. At the same time, however, the negative voltage for the automatic gain control which is supplied to the intermediate-frequency part may no longer increase too much since otherwise the anode current of the control intermediate frequency tubes would be cut off so that the intermediate-frequency output signal would not be transmitted. In the known devices the above described requirement, strong increase of the negative voltage for the automatic gain control which is supplied to the high-frequency part and only a small increase of the negative voltage for the automatic gain control which is supplied to the intermediate-frequency part, is realized by amplifying the automatic gain control voltage for the high-frequency part separately. However, this is costly and critical since in this case it deals with direct current amplification.

It is an object of the invention to maintain the advantages of the known device without, however, an additional amplification of the automatic gain control voltage for the high-frequency part being necessary. In order to achieve this, the circuit arrangement according to the invention is characterized in that in the output circuit of a high-frequency and/or mixer tube an ohmic resistor is included, the voltage produced across this ohmic resistor is supplied to such an electrode of the controlled intermediate-frequency tube, which is constructed as a screen grid tube, that after starting of the delay circuit the voltage between the screen grid and the cathode of said intermediate-frequency tube increases when the intensity of the input signal applied to the high-frequency part increases.

In order that the invention may readily be carried into effect, a possible embodiment of the circuit arrangement according to the invention will now be described, by way of example, with reference to the accompanying figures in which FIGURE 1 shows an embodiment of a circuit arrangement according to the invention FIGURE 2 shows anode current-grid voltage characteristics of an intermediate-frequency tube with the screen grid voltage as parameter.

In FIGURE 1, the two cascode-arranged triode tubes 1 and 2 constitute the high-frequency part of a television receiver. The signal received by means of the aerial 3 is supplied through the transformer 4 to the control grid of the triode 1. The cascode-arrangement shown is frequently used in the high-frequency part of television receivers, but it will be clear that the principle of the invention to be described below is not restricted to television receivers but may as well be used in radio-receivers or other superheterodyne receiving sets in which the automatic gain control for the high-frequency part is delayed with respect to that for the intermediate-frequency part.

The high-frequency signal supplied through the transformer 4 is supplied through the transformer 5, of which the secondary is tuned to the desired frequency by means of the stray capacitance 6, to the mixer part 7, in which the high-frequency signal is converted into an intermediate-frequency signal which is applied to the intermediate-frequency part of the receiver. This intermediate-frequency part consists of a number of intermediate-frequency amplifiers, of which in FIGURE 1 only two are shown, namely the amplifier 8 is shown diagrammatically and the amplifier 9 is shown in greater detail.

The output signal derived from the line 10 can be further amplified in one or more of the following intermediate-frequency amplifiers and then be detected for being handled in the normal manner. This handling comprises inter alia the production of a negative voltage for the automatic gain control which is directly proportional to the strength of the high-frequency signal entering via the aerial 3. This negative voltage for the automatic gain control $-V_{a.s.r.}$ is supplied to the line 11 and smoothed by means of a smoothing network consisting of a resistor 12 and a capacitor 13. The smoothed voltage for the automatic gain control is supplied through a leakage resistor 14 to the first control grid of the intermediate-frequency amplifier tube 9. If desired, as shown in FIGURE 1, this automatic gain control voltage may also be supplied through the resistor 15 to the intermediate-frequency amplifier 8 if the control of more than one intermediate-frequency tubes is desirable. However, control may alternatively be applied to an intermediate-frequency amplifier which succeeds the amplifier tube 9.

As shown in FIGURE 2, the amplifier tube 9 has a control characteristic which involves, as is known, that the slope S of the tube 9 varies as a function of the grid voltage $V_{g1}$ at the first control grid of this tube. When the signal intensity increases, the produced negative voltage for the automatic gain control $-V_{a.s.r.}$ increases as well as the negative control voltage $-V_{g1}$, so that the slope S with which the intermediate-frequency signal is handled in the tube 9 decreases and consequently also the amplification of the intermediate-frequency signal. In this manner it is achieved that the intermediate-frequency signal applied to the detector of the receiver can rather readily be kept constant independent of the intensity of the signal entering via the aerial 3.

As already stated in the introduction the control of the intermediate-frequency part is to be carried through to such an extent that a signal having the maximally possible intensity is operative at the first control grid of the tube 9, for in that case the signal-to-noise ratio will be as favourable as possible. This is also of importance for this reason that the mixer part 7 itself can still produce a certain amount of noise.

In addition, the grid voltage $-V_{g1}$ must be as large as possible since the intermediate-frequency signal must be handled in the tube 9 with a maximum intensity with a minimum slope S. However, all this may not be carried through to such an extent that the input voltage of the mixer part 7 becomes large so that too large a cross-modulation will occur in this mixer part. However, if one proceeds to substantially the limit where cross-modulation is still permissible (for example 1% cross modulation), as already stated in the introduction, the input voltage for the mixer part may hardly increase from the beginning of the automatic gain control for the high-frequency part. However, this means that also the output voltage of the mixer part will hardly increase while small increases must still result in an increasing negative voltage for the automatic gain control. Since, however, in the circuit arrangement according to the invention no direct current amplifier is provided between the capacitor 13 and the delaying part for the high-frequency control, it must be ensured in a different manner that from the instant at which the high-frequency control begins all the same a sufficient large increase of the voltage for the automatic gain control for this high-frequency part is possible without the voltage for the mixer part increasing noticeably while in addition it must be ensured that the increase of the negative grid voltage $-V_{g1}$ at the control grid of the intermediate-frequency tube 9 does not cut off the anode current of this tube or decrease it at least to such an extent that the intermediate-frequency signal is distorted. This latter phenomenon may be explained as follows.

Let is be assumed that the screen grid voltage $V_{g2}$ of the tube 9 in FIGURE 1 is adjusted to the value $V_{g21}$, then its anode-current grid voltage characteristic ($i_a$—$V_{g1}$-characteristic) will vary as shown by the curve 16 in FIGURE 2. Let it further be assumed that at the maximum signal intensity to which the intermediate frequency signal may increase before the high-frequency control begins, a negative grid voltage $-V_{g11}$ is produced through the automatic gain control, as indicated by the broken line 17. The intermediate-frequency signal, which fluctuates around the average value $-V_{g11}$, will then control in the correct manner the anode current $i_a$ of the tube 9 so that no distortion of the intermediate-frequency signal occurs. Now, if the grid voltage increases to the value $-V_{g12}$, indicated by the broken line 29 in FIGURE 2, the value determined by the point 18 will be exceeded during a great part of the occurrence of the intermediate-frequency signal. In that case the anode current $i_a$ will be cut off during the exceeding of the point 18 and will no longer be a true image of the intermediate-frequency control signal.

As appears from FIGURE 1, the negative voltage for the automatic gain control which is set up across the capacitor 13 is supplied to the anode of the delaying diode 20 through the resistor 19. The anode of the delaying diode 20 is connected to a positive delay voltage $+V_u$ through a further resistor 21. The value of the positive delay voltage $V_u$ plus the ratio between the resistance values of the resistors 19 and 21 determines at which value of the negative voltage across the capacitor 13 the diode 20 is no longer conductive. When the diode 20 is no longer conductive, the anode of this diode is no longer substantially at earth potential and this, consequently, is also the case with the control grid voltage of the triode 1, so that from this instant on the automatic gain control for the high-frequency part sets in. As appears from FIGURE 1, the negative voltage for the control grid of the high-frequency triode 1 consequently increases to the same extent as the negative control voltage for the intermediate-frequency tube 9 from the instant that the diode 20 has come in the non-conductive condition.

In order to ensure that in this situation with the intensity of the aerial signal increasing substantially no increase of the input signal and the mixer part 7 occurs all the same, according to the principle of the invention, a resistor 22 is included in series with the primary of the transformer 5. The junction of this primary and the resistor 22 is connected through the conductor 23 and the resistor 24 to the screen grid 25 of the intermediate-frequency amplifier tube 9. Further, the conductor 23 is connected to earth via a large capacitor 26 to ensure that the high-frequency signal which is developed across the resistor 22 cannot penetrate to the screen grid 25 to disturb the intermediate-frequency signal there. In addition, the screen grid 25 is connected to earth via a further capacitor 27 for conducting away the intermediate-frequency signal formed across the resistor 24.

The operation of the measure according to the invention is as follows. After the diode 20 is no longer in the conductive condition, both the negative voltage at the control grid of the tube 9 and at the tube 1 increase when the intensity of the incoming high-frequency signal increases. Also the tubes 1 and 2 have a control characteristic, so that the slope S also of the cascode arrangement decreases and, consequently, the amplification of the incoming high-frequency signal. In addition, however, the anode current $i_a$ through the cascode arrangement and consequently the voltage drop across the resistor 22 decrease. Therewith the voltage at the junction of the resistor 22 and the primary of the transformer 5 increases as a result of which the voltage $V_{g2}$ at the screen 25 increases. If, therefore, the screen grid 25 had a voltage of $V_{g21}$ volt just before the diode 20 is set in the non-conductive condition, this voltage will decrease to a value of $V_{a22}$ volt ($V_{g22}>V_{g21}$) when the high-frequency control has set in and the signal intensity of the incoming high-frequency has increased. As a result of the increase of the screen grid voltage to the value $V_{g22}$, also the anode current-grid voltage characteristic of the tube 9 is shifted and is now determined by the curve 28 in FIGURE 2. This is necessary, for as a result of the decreasing signal intensity of the incoming signal also the intensity of the intermediate-frequency signal has increased a little because no separate amplification of the automatic gain control voltage for the high-frequency part takes place and, consequently, also the negative voltage is increased which is supplied to the control grid of the tube 9. This is shown in FIGURE 2 somewhat exaggeratedly, because it is assumed that the negative grid voltage has increased from a value $-V_{g11}$ which is associated with the curve 16, to a value $-V_{g12}$ indicated by the broken line 29 which is associated with the curve 28. The variation of the curve 28 must now be such that the intermediate-frequency signal which fluctuates around the new grid voltage $-V_{g12}$ is handled with a somewhat larger slope than in the case of the curve 16 while distortion of the anode current $i_a$ need not be feared since the cut-off point is shifted from point 18 to point 30.

Because the slope S, with which the intermediate-frequency signal which fluctuates around the line 29 is handled, has become somewhat larger, this intermediate-frequency signal is amplified to a greater extent than when it fluctuates around the line 17. In spite of the fact that the input signal for the mixer part 7 and consequently also that of the intermediate-frequency tube 9 has hardly increased after the beginning of the high-frequency control, the output signal of the tube 9 will have increased and that sufficiently to effect the increase of the grid voltage from $-V_{g11}$ to $-V_{g12}$ volt after further amplification and rectification.

It will be clear that according as the signal intensity of the incoming signal still further increases, the negative voltage for the automatic gain control also increases and therewith the screen voltage of the tube 9 to a value of $V_{g23}$ volt and its control grid voltage to a value of $-V_{g13}$ volt, to which are associated a curve 31 and a broken line 32 respectively. After the above explanation it will be clear that a stronger intermediate-frequency output signal can again be obtained by means of the curve 31, while the input signal for the mixer part 7 hardly increases.

It is true, in the principle according to the invention, the intermediate-frequency signal which is ultimately applied to the detector of the receiver, can be kept somewhat less constant than when the automatic gain control voltage which is supplied to the high-frequency part is amplified indeed, but on the other hand the cross-modulation can be kept below 1% with certainty also if for starting the high-frequency control, one proceeds as far as the edge of the driving possibility insofar as the mixer part 7 is concerned. When using an additional amplification of the automatic gain control voltage for the high frequency part, this certainty can be obtained with much more difficulty without the measure according to the invention since this requires a particularly high increase of this amplification. In connection with the fact that in this case it deals with direct current amplification, this can be met only with difficulty in practice.

Therefore, in addition to a saving of material with a good signal-to-noise ratio for the mixer part, the measure according to the invention gives more certainty against undesired cross-modulation.

Although above the measure according to the invention is described exclusively for the intermediate-frequency amplifier tube 9, it can be applied in a corresponding manner to the intermediate-frequency amplifier 8 which may be constructed in exactly the same manner as the intermediate-frequency amplifier 9. In that case, the screen grid of the intermediate-frequency amplifier tube of the part 8 is connected through the resistor 33 to the conductor 23, and a capacitor 24 ensures the smoothing of the screen grid voltage of this part. The additional amplification after the high-frequency control has set in has become even larger so that the input voltage for the mixer part 7 can with even more certainty be kept below that value which may cause too large a cross-modulation even if the high-frequency control is caused to set in substantially at the edge of this value. Naturally, it is also possible to apply the measure according to the invention to a controlled intermediate-frequency amplifier tube, which succeeds the intermediate-frequency amplifier 9.

Alternatively it is not necessary for the intermediate frequency amplifier tubes to be pentodes. Tubes having two or having more than three grids may be used also. The main thing only is that a screen grid tube is used to which the direct voltage is supplied which is derived from the junction of the resistor 22 and the primary of the transformer 5.

It will further be clear that the measure according to the invention may also be used for the mixer part 7. In that case a negative control voltage is applied to the control grid of the mixer tube included in the mixer part 7 which voltage is derived from the anode of the delaying diode 20. In that case the resistance 22 may be connected in series not only with the output impedance of the tube 2 but also in series with the output impedance of the mixer tube. The decoupling by means of the capacitor 26 in that case serves to ensure that neither the high-frequency signal nor the intermediate-frequency signal can penetrate to the screen grid 25. Of course it is also possible when controlling the mixer tube to connect the resistor 22 only in series with the output impedance of this mixer tube.

In addition the possibility exists to connect the cathode of the tubes 1 and 9 together or, if a small negative feedback coupling for the tube 9 is deemed desirable, to connect the end of the resistor 35, which is connected to earth, to the cathode of the tube 1. In that case, when the high-frequency control sets in, the voltage at the cathode of the tube 1 will decrease and consequently also that at the cathode of the tube 9. Since the screen grid voltage $V_{g2}$ of this tube increases, the voltage between the screen grid 25 and the cathode of the tube 9 will experience an even larger increase as a result of which a further shift of the $i_a-V_{g1}$ curve becomes possible. If desired, it is of course also possible to omit the control via the resistor 22 and to connect the resistor 24 directly to the supply voltage $+V_b$ in which, naturally, the cathode voltage of the tube 1 must take along the cathode voltage of the tube 9 when the high-frequency control sets in.

Finally it is pointed out that the use of a cascode arrangement is not strictly necessary. A single high-frequency amplifier tube with the series arrangement of a high-frequency output impedance and an ohmic resistor included in its anode circuit may also be used for using the principle according to the invention.

The value of the resistor 22 may be determined as follows. If the resistor 24 has a resistance value of $R_{24}$ ohm and the internal screen grid resistance of tube 9 equals $R_{ig2}$ ohm, then, in case of a variation $dV_a$ of the voltage at the junction point of the resistor 22 and the primary of the transformer 5, the screen grid voltage variation $dV_{g2}$ at the screen grid 25 will be given by:

$$dV_{g2}=\frac{R_{ig2}}{R_{ig2}+R_{24}}\cdot dV_a \qquad (1)$$

The voltage $V_a$ is determined by:

$$V_a=V_b-i_aR_{22}=V_b-SV_{g1}R_{22} \qquad (2)$$

where $V_b$ is the supply voltage for and $i_a$ the anode current through the cascode arrangement, $R_{22}$ the resistance value of the resistor 22, S the slope of the cascode arrangement (in which it is assumed that the slopes of the tubes 1 and 2 are equal to one another) and $V_{g1}$ is the control grid voltage of the tube 1.

When the grid voltage $dV_{g1}$ of the tube 1 varies as a result of variation of the negative voltage produced by the automatic gain control, one finds for the anode voltage variation:

$$dV_a=-SR_{22}dV_{g1}$$

When completed in Equation 1 this gives:

$$dV_{g2}=-\frac{R_{ig2}}{R_{ig2}+R_{24}}SR_{22}dV_{g1} \qquad (3)$$

Since, after the high-frequency control has started, the grid voltage variation $dV_{g1}$ at the control grid of the tube 1 is equal to that for the tube 9, in Equation 3 for $dV_{g1}$ also the grid voltage variation of the tube 9 may be read.

Now:

$$\frac{dV_{g2}}{dV_{g1}}=\mu_{g1g2}$$

where $\mu_{g1g2}$ is the amplification factor between the first control grid and the screen grid of the tube 9. With this latter equation, Equation 3 becomes:

$$\mu_{g1g2}=-\frac{R_{ig2}}{R_{ig2}+R_{24}}SR_{22} \qquad (4)$$

Since $\mu_{g1g2}$ and $R_{ig2}$ are constants which are substantially determined by the properties of the tube 9, the value of the resistor 22 can be determined from the Equation 4 in case of suitable choice of the slope S and with the value of $R_{24}$ given.

The only variable quantity in Equation 4 is the slope S of the cascode arrangement which, as a matter of fact, varies with varying grid voltage $V_{g1}$. The best choice of the slope S is its average value which lies approximately half way between the maximum and minimum slope, which may occur during the control of the high frequency part, of the cascode arrangement.

What is claimed is:

1. A signal amplifying system comprising a source of signals, a first amplifying stage comprising a first amplifying device having a control and an output electrode, means applying said signals to said control electrode, a second amplifying stage comprising an amplifying device having first and second control electrodes and an output electrode, means for coupling signals at the output electrode of said first amplifying device to said first control electrode, a source of gain control voltage, means for applying said gain control voltage to said first control electrode threshold means for applying said control voltage to the control electrode of said first amplifying device whereby a direct voltage that is a function of said control voltage appears at the output electrode of said first amplifying device when said control voltage exceeds the threshold level of said threshold device, means for applying said direct voltage to said second control electrode, and output circuit means connected to the output electrode of said second amplifying device.

2. A signal amplifying system comprising a source of signals, a first amplifying device having a first control electrode, a first common electrode, and a first output electrode, means applying said signals between said first control electrode and first common electrode, a second amplifying device having second and third control electrodes, a second common electrode, and a second output electrode, means for coupling signals from said first output electrode to said second control electrode, a source of a gain control voltage having an amplitude that is a function of the signal amplitude at said second output electrode, means applying said control voltage between said second control electrode and second common electrode, threshold means for applying said control voltage between said first control electrode and first common electrode when it exceeds a predetermined amplitude, whereby a direct voltage that is a function of said control voltage occurs at said first output electrode, means for applying said direct voltage to said third control electrode, and output circuit means connected to said second output electrode.

3. A superheterodyne receiver comprising a first amplifier for amplifying high frequency signals, a mixer for converting the output of said first amplifier to a lower frequency, a second amplifier for amplifying the output of said mixer, and means providing a gain control voltage that is a function of the signal output of said second amplifier, said first amplifier comprising a first amplifying device having an input circuit and an output circuit, said output circuit comprising a resistor, said second amplifier comprising a second amplifying device having first and second control electrodes and an output electrode, means applying the output of said mixer and said gain control voltage to said first electrode, threshold means for applying said control voltage to said input circuit whereby said control voltage is applied to said input circuit only when it exceeds a predetermined amplitude and a direct voltage proportional to said control voltage is developed across said resistor, and means applying said direct voltage to said second control electrode.

4. A superheterodyne receiver comprising a first amplifier for amplifying high frequency signals, a mixer for converting the output of said first amplifier to a lower frequency, a second amplifier for amplifying the output of said mixer, and means providing a gain control voltage that is a function of the signal output of said second amplifier, said first amplifier comprising a first electron discharge device having a first cathode, a first control grid and an anode, an input circuit connected between said first control grid and first cathode, an output circuit comprising a high frequency output signal coupling network and a resistor, means connecting said output circuit to said anode whereby a direct voltage is developed across said resistor that is proportional to the bias on said first device, said second amplifier comprising an electron discharge device having a second cathode, a second control grid, a screen grid, and a second anode, means applying said control voltage and the output of said mixer between said second control grid and second anode, threshold circuit means for applying said control voltage between said first anode and first cathode only when it exceeds a predetermined amplitude, means applying said direct voltage to said screen grid whereby the voltage between said screen grid and second cathode increases with increasing signal amplitude applied to said input circuit when said control voltage exceeds said predetermined amplitude.

5. A superheterodyne receiver comprising a first amplifier for amplifying high frequency signals, a mixer connected to convert the output frequency of said first amplifier to a lower frequency, a second amplifier connected to amplify the output of said mixer, means for providing a gain control voltage that has an amplitude that is a function of the output of said second amplifier, and a source of operating voltage having positive and negative terminals, said first amplifier comprising a first electron discharge device having a first control grid, a first cathode, a first anode, an input circuit connected between said first control grid and first cathode and connecting said cathode to said negative terminal, an output circuit comprising a signal coupling network and a resistor connected in that order between said first anode and positive terminal, and capacitor means connected to said resistor whereby a direct voltage appearing at the junction of said resistor and signal coupling network has an amplitude proportional to the bias on said first discharge device, said second amplifier comprising a second discharge device having a second control grid, a second cathode, a screen grid, and a second anode, means applying said control voltage and the output of said mixer between said second control grid and second cathode, threshold means for applying said control voltage to said input circuit when it exceeds a predetermined amplitude, and direct current conductive means connecting said junction to said screen grid.

6. The receiver of claim 5, in which said means connecting said screen grid to said junction comprises a second resistor, the resistance of said second resistor and said first-mentioned resistor being selected to satisfy the expression:

$$\mu=-\frac{R_3}{R_3+R_2}SR_1$$

wherein $\mu$ is the amplification factor between the second grid and screen grid of said second device, $R_1$ is the resistance of said first-mentioned resistor, $R_2$ is the reistance of said second resistor, $R_3$ is the internal screen grid resistance of said second device, and S is the slope of the anode current-grid voltage characteristic of said first electron discharge device.

No references cited.

KATHLEEN H. CLAFFY, *Primary Examiner.*

R. LINN, *Assistant Examiner.*